United States Patent [19]
Hause et al.

[11] Patent Number: 5,918,130
[45] Date of Patent: Jun. 29, 1999

[54] TRANSISTOR FABRICATION EMPLOYING FORMATION OF SILICIDE ACROSS SOURCE AND DRAIN REGIONS PRIOR TO FORMATION OF THE GATE CONDUCTOR

[75] Inventors: Fred N. Hause, Austin; Mark I. Gardner, Cedar Creek; H. Jim Fulford, Jr., Austin, all of Tex.

[73] Assignee: Advanced Micro Devices, Inc.

[21] Appl. No.: 08/929,197

[22] Filed: Sep. 8, 1997

[51] Int. Cl.$^6$ .................................................. H01L 21/336
[52] U.S. Cl. ........................ 438/290; 438/174; 438/180; 438/301; 438/683; 438/951; 148/DIG. 100; 257/384; 257/408
[58] Field of Search ..................................... 438/174, 180, 438/289, 290, 951, 291, 301, 682, 683, FOR 204, FOR 205, FOR 188, FOR 346, FOR 555; 148/DIG. 100; 257/384, 408

[56] References Cited

U.S. PATENT DOCUMENTS

| | | | |
|---|---|---|---|
| 4,683,645 | 8/1987 | Naguib et al. | 438/301 |
| 4,731,339 | 3/1988 | Ryan et al. | 438/174 |
| 4,992,387 | 2/1991 | Tamura | 438/174 |
| 5,445,977 | 8/1995 | Fujimoto | 438/174 |
| 5,576,227 | 11/1996 | Hsu | 438/291 |
| 5,583,067 | 12/1996 | Sanchez | 438/291 |

FOREIGN PATENT DOCUMENTS

| | | | |
|---|---|---|---|
| 359034665 | 2/1984 | Japan | 438/205 |
| 360195978 | 10/1985 | Japan | 438/205 |

OTHER PUBLICATIONS

U.S. application No. 09/120,557; filed Jul. 22, 1998.
U.S. application No. 09/173,273; filed Oct. 15, 1998.
U.S. application No. 09/173,233; filed Oct. 15, 1998.
U.S. application No. 09/135,826; filed Aug. 18, 1998.

*Primary Examiner*—Michael Trinh
*Assistant Examiner*—Long Pham
*Attorney, Agent, or Firm*—Kevin L. Daffer; Conley, Rose & Tayon

[57] ABSTRACT

The present invention advantageously provides a method for forming a transistor in which silicide contact areas are formed to the junctions during fabrication of the transistor. The silicide contact areas may be formed using a single high temperature anneal since silicide forming near sidewalls of the gate oxide is prevented. In one embodiment, dopants are first forwarded into a lateral region of a silicon-based substrate to form an implant region. Then a silicide layer is formed across the implant region using a high temperature anneal. A sacrificial material is deposited across the silicide layer and the substrate. A contiguous opening is formed vertically through the sacrificial material and the silicide layer, exposing a portion of the substrate. Dopants of the type opposite to the dopants implanted previously are then implanted into the exposed substrate region to form a channel. Thus, the implant region is separated into source and drain regions having a channel interposed between them. Spacers may be formed on opposed sidewall surfaces of the sacrificial material within the opening. A gate oxide is then formed across the exposed region, followed by the formation of a polysilicon gate conductor across the gate oxide. A polycide is formed across the gate conductor before the sacrificial material is removed.

11 Claims, 4 Drawing Sheets

TRANSISTOR FABRICATION EMPLOYING FORMATION OF SILICIDE ACROSS SOURCE AND DRAIN REGIONS PRIOR TO FORMATION OF THE GATE CONDUCTOR

BACKGROUND OF THE INVENTION

1. Field of the Invention

This invention relates to integrated circuit fabrication and, more particularly, to forming a highly conductive silicide across the source/drain regions of a transistor using a one-step anneal. The source/drain regions of the transistor are advantageously formed by etching through a single ("unitary") implant area.

2. Description of the Related Art

Active electronic devices are well known in the art. They are classified as any device which is not passive. A transistor is but one example of an active device. Therefore, a transistor is regarded as a basic building block of an integrated circuit containing numerous, interconnected active devices.

Transistor fabrication typically involves forming a gate conductor spaced from a single crystalline silicon substrate by a gate dielectric. Source/drain impurity regions (hereinafter "junctions") are then formed within the substrate, using the gate conductor as an implant mask, according to the well known self-aligned process. The gate conductor therefore ends up interposed between a pair of junctions, all of which are formed exclusively within active areas of the substrate.

Isolation structures are used to isolate the junctions of a transistor from other active areas spaced throughout the substrate. Isolation structures may comprise shallow trenches etched in the substrate that are filled with a dielectric using, e.g., chemical vapor deposition. Alternately, isolation structures may comprise local oxidation of silicon ("LOCOS") structures which are thermally grown using, e.g., wet oxidation.

Ion implantation of dopants is primarily used to form junctions. Alternatively, although less often used, junctions may be formed by diffusion doping. Ion implantation involves placing energetic, charged atoms or molecules directly into the substrate surface. The resulting junctions self-align between the isolation structures and, if used, oxide spacers arranged on opposing sidewall surfaces of the gate conductor. The number of implanted dopant atoms entering the substrate is more easily controlled using ion implantation. Ion implantation results injunctions having a majority carrier opposite that of the surrounding bulk substrate or well area.

In order to form highly conductive ohmic contacts in connecting regions (i.e., "windows") between transistor junctions and overlying interconnect, it is oftentimes necessary to incorporate a layer of refractory metal at the juncture. The refractory metal, when subjected to high enough temperature, reacts with the silicon substrate in the contact window to form what is commonly called a "silicide". Any unreacted metal is removed after formation of the silicide. Silicides are well known in the art and provide dependable silicon contact as well as low ohmic resistance.

Self-aligned silicides on source/drain junctions, i.e., "salicides", have increased in popularity due to the shrinking dimensions of conventional transistors. As the contact window decreases in size, it is important that contact resistance remain relatively low. Further, aligning contact windows via a separate masking step makes minimizing source/drain junctions difficult. For these reasons, salicides have become a mainstay in semiconductor processing due to their ease of application—i.e., their self-aligned application. When a metal is deposited and heated on a semiconductor topography, the silicide reaction occurs wherever the metal is in contact with a region heavily concentrated with silicon. For example, silicide contacts may be formed simultaneously over junctions of a silicon-based substrate and over a polycrystalline silicon ("polysilicon") gate. However, as device dimensions shrink, so does the spacing between contact windows. Thus, lateral, silicide migration between closely spaced contact windows must be carefully monitored and controlled. Otherwise, a phenomenon often referred to as silicide shorting or "bridging" can occur.

Bridging often arises when a silicide, such as titanium silicide is allowed to form between silicon contact windows, such as between a polysilicon gate and junctions arranged within a silicon-based substrate. In a lightly doped drain (LDD) process, sidewall spacers normally exist on lateral surfaces of the gate conductor so that heavily concentrated source/drain junctions may be formed which are spaced from the gate. The sidewall spacers are relatively small in size. They are typically composed of silicon dioxide or silicon nitride. During the anneal stage of titanium silicide formation, the semiconductor topography undergoes temperature cycling in an inert-gas. Silicon atoms within the spacers may diffuse into regions of the titanium arranged upon the spacers, or vice versa. The silicon and the titanium may react over or within the spacer regions, causing titanium silicide to undesirably form. Unfortunately, the presence of titanium silicide at the spacers provides a capacitive-coupled or fully conductive path between the polysilicon gate conductor and the source/drain junctions.

Titanium silicide shorting can, in some instances, be prevented if the anneal cycle is carefully controlled. Many researchers advocate a multiple step salicide forming process. First, a refractory metal such as titanium is deposited over the entire wafer. Next, the metal film is heated to a low temperature in the presence of a nitrogen ambient in order to form a reacted, relatively high-resistance silicide in the contact windows. The low temperature nature of this anneal step helps inhibit cross-diffusion between silicon atoms within a spacer and titanium atoms of the metal layer. After the first anneal, the unreacted metal is removed using a wet chemical etch (e.g., $NH_4OH:H_2O_2:H_2O$), thereby leaving reacted metal or metal silicide in the contact windows. Finally, a higher temperature anneal is performed in order to produce a lower resistivity silicide.

Two anneal steps are typically used to prevent unwanted or excessive silicide formation in regions where silicide is undesired, e.g., in the gate sidewall spacer which bears only a relatively low concentration of silicon. Additionally, it is important that the anneal steps promote silicide formation in regions where silicon concentration is relatively high, e.g., upon the conductor and the source/drain junctions. If the first anneal temperature is comparable to the second (higher) anneal temperature, then silicon dioxide layers could be consumed by the formation of silicide. Thus, the first anneal must be maintained at a maximum temperature of approximately 600–700° C., while the subsequent anneal may extend well above 850° C.

This two step anneal process has its share of problems. First, the silicon substrate is removed from the annealing chamber after the first anneal to etch the remaining metal therefrom. The withdrawal of the substrate from the chamber allows native oxides or other impurities to grow or deposit upon the reacted metal silicide. Such impurities may increase contact resistance in the contact window. Further, if the first anneal temperature exceeds a pre-determined level, unwanted salicidation may occur on spacers adjacent to the sidewalls of the gate conductor. Unfortunately, when the contact window contains a heavily doped source/drain junction, it is often necessary to increase the first anneal temperature given the relative absence of silicon with respect to impurity atoms.

It is therefore desirable that a semiconductor fabrication process be developed in which highly conductive silicide contacts are formed that exhibit no silicide shorting. Thus, it is important to heat the refractory metal within the contact window to a relatively high temperature so that silicide formation therein is promoted. However, it is also critical that the interaction of silicon atoms with metal atoms during high temperature anneal is avoided in areas where silicide formation is undesired. Yet further, a process is needed whereby the contact area is not exposed to atmospheric conditions during the formation of a silicide that exhibits low resistivity. Preventing the exposure of the silicide to ambient oxide is necessary to ensure good ohmic contact at contact windows of the transistor.

SUMMARY OF THE INVENTION

The problems outlined above are in large part solved by the transistor formation technique hereof The present invention advantageously provides a method for forming silicide contacts to regions of a transistor using a single high temperature anneal, rather than two anneal cycles interposed with an expose/etch step.

In one embodiment, a silicide (e.g., titanium silicide) is first formed across a doped region. The doped region may be disposed within a silicon-based substrate or well region having a majority charge carrier opposite that of the doped region. Formation of the titanium silicide involves depositing a titanium layer across the substrate and subsequently heating the layer to a high temperature. This anneal step promotes the reaction of titanium atoms with silicon atoms in the underlying substrate to form silicide at the titanium layer/substrate interface. Since the gate conductor and spacers have not yet been formed, there is no need to be concerned with silicide undesirably forming upon or within certain features employed by the transistor. Therefore, only one anneal step is required to form silicide contacts to the junctions. The temperature of this anneal step may extend well over 800° C., possibly above 1000° C., since silicide formation is not limited to specific areas and the danger of bridging is virtually non-existent. Because of the relatively high temperature of the anneal, the titanium/silicon reaction occurs readily so that all or most of the titanium atoms are bonded to silicon atoms within the active regions between isolation structures. Thus, the anneal step promotes the formation of a titanium silicide layer across the substrate that exhibits low resistivity. Another advantage of the one-step anneal is that the titanium silicide is prevented from being exposed to ambient oxygen and other impurities during the processing of the silicide. The one-step titanium silicide is not only easier to employ but also provides enhanced ohmic conductivity absent exposure to deleterious materials during contact formation.

Titanium silicide only forms in active regions between oxide-based isolation structures. Alternatively, titanium silicide may then be removed from all regions of the substrate except from above the doped region of the active areas. A sacrificial material, e.g., silicon dioxide ("sacrificial oxide"), is deposited across the silicon-based substrate. A portion of the sacrificial oxide may be etched away to form an opening that extends vertically through the material to the underlying substrate. The opening may form a recess in the doped region, separating the silicide-covered doped region into a source junction and a drain junction. Dopants are then forwarded into a region of the substrate exposed by the opening directly below the recess to form a channel between the source and drain junctions and to adjust the threshold voltage of the ensuing transistor. Nitride spacers may be formed on opposite sidewalls of the sacrificial oxide material within the opening. A gate oxide is then thermally grown upon the substrate within the recess channel concurrent with the formation of lightly doped drain areas laterally adjacent to the junctions. Polysilicon is deposited across the sacrificial material and into the opening extending through the oxide sacrificial material. Excess portions of the polysilicon are removed to form a conductor arranged within the opening across the gate oxide.

A silicide, i.e., "polycide" is formed across the polysilicon gate conductor. The silicide is advantageously formed while the sacrificial oxide is maintained adjacent to the sidewalls of the gate conductor. Formation of the polycide is similar to that of the silicide disposed across the junctions of the transistor. A one-step high temperature anneal is used to initiate reaction of a metal layer above the gate conductor with silicon atoms within the polysilicon gate conductor. The presence of sacrificial oxide prevents metal atoms from reacting with the nitride spacers located adjacent to the sidewalls of the gate conductor. In fact, the sacrificial oxide only permits silicide to form above the sacrificial oxide and the gate conductor. High temperature anneal promotes formation of a low resistivity polycide. Although some silicide may form across the upper surface of the sacrificial oxide, the reaction is limited there since few silicon atoms are available for bonding. The silicon atoms of the sacrificial oxide are instead bonded to oxygen atoms. The sacrificial oxide acts to prohibit silicide formation in the area between the junction silicide and the polycide, thereby preventing so called "bridging" effects. The sacrificial material, along with any silicide formed upon the sacrificial material, is preferably removed in a subsequent etch/strip step. The resulting transistor has silicide and polycide contact areas that function as good ohmic contacts with no bridging opportunities.

BRIEF DESCRIPTION OF THE DRAWINGS

Other objects and advantages of the invention will become apparent upon reading the following detailed description and upon reference to the accompanying drawings in which.

Figure 1:
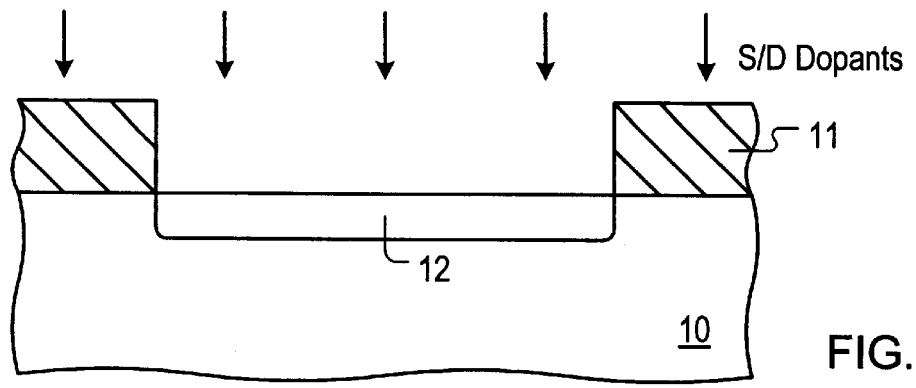
FIG. 1 depicts a cross-sectional view of a semiconductor topography in which a laterally extending region of a silicon-based substrate is implanted with dopants.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning to FIG. 1, a single crystalline silicon substrate 10 is depicted as having photoresist 11 disposed across select portions of substrate 10. According to one embodiment of the present invention, dopants are implanted into a laterally extending region of substrate 10. Photoresist 11 acts as a mask and prevents dopants from being implanted into regions of substrate 10 covered by the photoresist. A heavily doped implant region 12 occurs which contains a majority charge carrier opposite to that of substrate 10. Alternately, a well region (not shown) may be formed within substrate 10 by doping the substrate such that the peak concentration of the well region is below the peak concentration of implant region 12. In this case, implant region 12 is preferably formed such that it contains a majority charge carrier opposite to that of the well region. Implant region 12 may be doped with n-type or p-type dopants, depending on the type of transistor being formed. Some commonly used n-type dopants are arsenic or phosphorus, and some commonly used p-type dopants are boron or boron difluoride. If the impurity dopant material used for forming implant region 12 is n-type, then the resulting transistor is an NMOSFET ("n-channel") transistor device. Conversely, if the source/drain dopant material is p-type, then the resulting transistor is a PMOSFET ("p-channel") transistor device.

According to another embodiment, implant 12 results from a blanket implant absent photoresist 11. In this instance, an isolation structure pre-exists which prevents ingress of the implant into the substrate except for the area shown as reference numeral 12. The isolation structure can be formed using shallow trench isolation or LOCOS processes.

Figure 2:
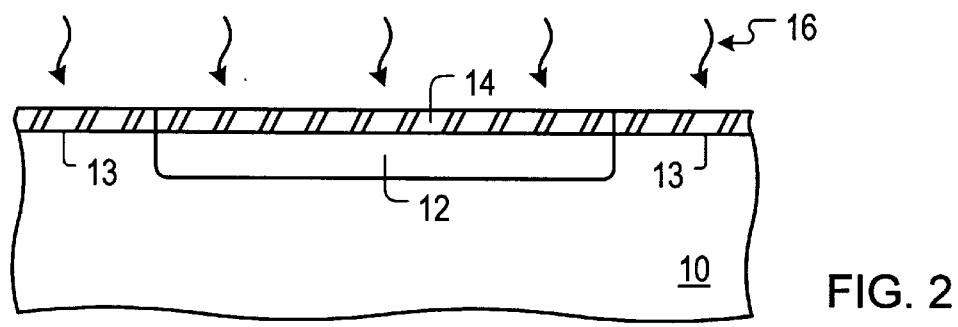
FIG. 2 depicts a cross-sectional view of the semiconductor topography, wherein a titanium silicide layer is formed across the upper surface of the doped region of the substrate using a one-step anneal.

FIG. 2 depicts the formation of a silicide layer 14 exclusively across heavily doped implant region 12. According to one example, silicide layer 14 comprises titanium silicide formed by first blanket depositing a titanium layer across the entire surface of substrate 10. The titanium layer is then exposed to thermal radiation 16 to heat the layer to a temperature well above 800° C. Upon being exposed to a high temperature, titanium atoms and silicon atoms of substrate 10 migrate, resulting in cross-diffusion of these atoms. The titanium atoms and the silicon atoms then undergo reaction to form a titanium silicide layer across the upper surface of substrate 10. Optical lithography may be used to pattern a photoresist masking layer (not shown) above implant region 12. Then a dry, plasma etch may be used to remove the excess titanium silicide 13 that forms across areas of substrate 10 other than implant region 12. If the isolation structure is used, then only minimal reaction into the oxide-based isolation structure occurs. This results in silicide 14 only forming into and upon implant region 12, between isolation structures. Whichever technique is used, a low resistivity titanium silicide layer 14 results that is disposed exclusively across implant region 12.

Figure 3:
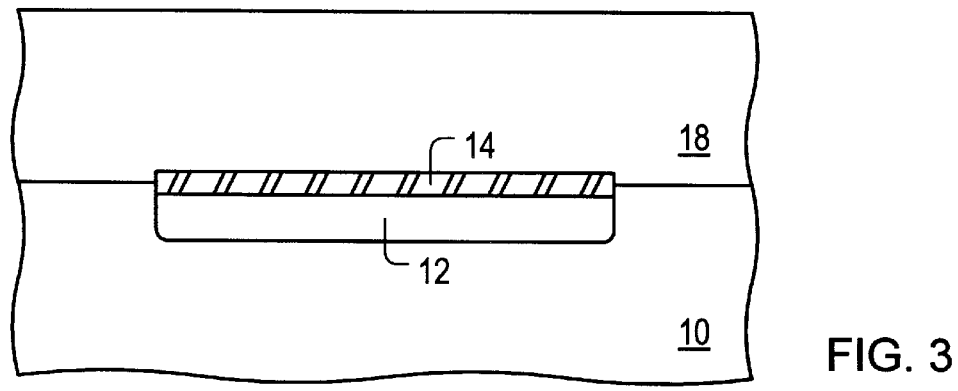
FIG. 3 depicts a cross-sectional view of the semiconductor topography, wherein a sacrificial oxide is deposited across the upper surface of the titanium silicide layer and the exposed regions of the substrate.
Figure 4:
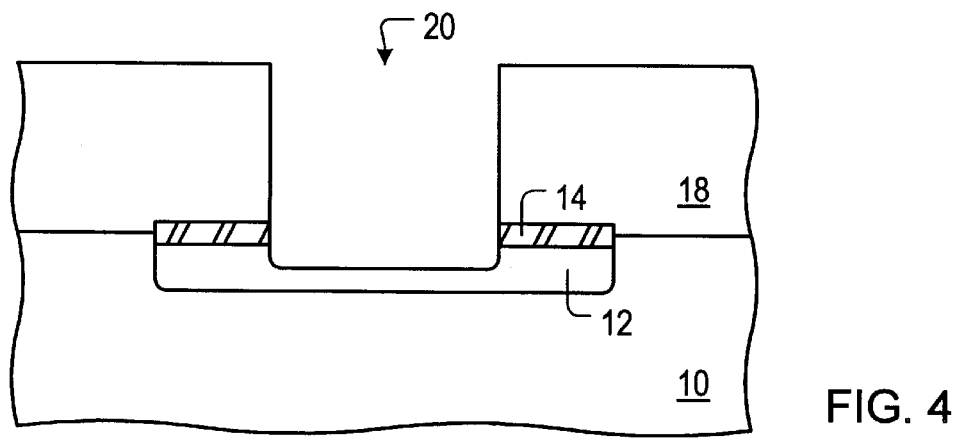
FIG. 4 depicts a cross-sectional view of the semiconductor topography, wherein an opening is formed vertically through the sacrificial oxide, the silicide layer, and at least partially through the doped region, thereby separating the region into a source junction and a drain junction.

As shown in FIG. 3, a sacrificial material 18 preferably composed of oxide may be blanket deposited across silicide layer 14 and the exposed portions of substrate 10. The purpose of sacrificial material 18 is to provide for the formation of a transistor. Therefore, sacrificial material 18 may be disposed of after such a transistor has been formed. Sacrificial material 18 may also be made of other materials, such as silicon nitride or silicate glass. FIG. 4 depicts the formation of an opening 20 that extends contiguously through a portion of sacrificial material 18 and a portion of silicide layer 14 down to substrate 10. Opening 20 may be formed using a dry, plasma etch step. Etch duration is chosen to terminate after material has been removed to a predetermined depth below the surface of substrate 10. As shown in FIG. 4, opening 20 may extend through a large portion of the thickness of implant region 12 such that a recess exists in implant region 12. Only a very thin region of implant region 12 may remain underneath the recess. Alternately, opening 20 may terminate at the upper surface of implant region 12, or it may extend through the entire thickness of implant region 12, depending on design specifications.

Figure 5:
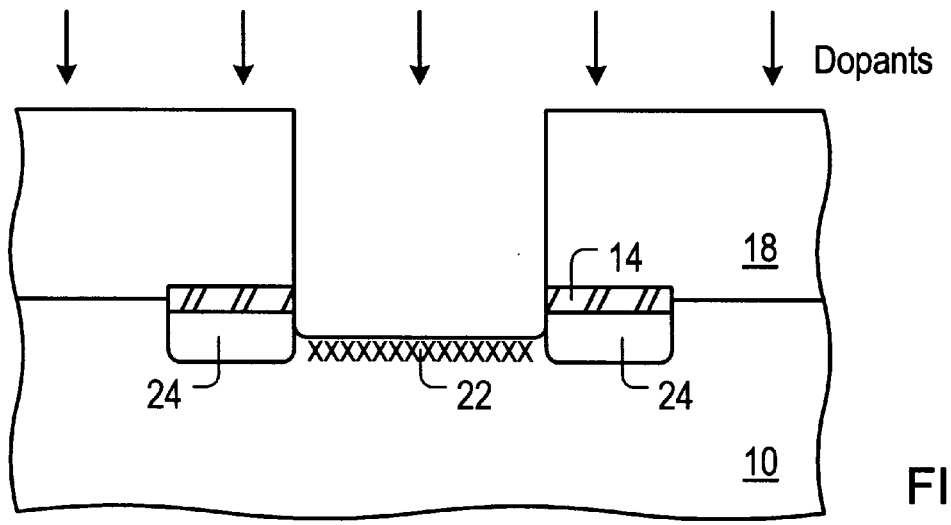
FIG. 5 depicts a cross-sectional view of the semiconductor topography, wherein dopants are implanted into the exposed region of the substrate to adjust the threshold of the channel between the source and drain junctions.

Turning to FIG. 5, dopants of the type opposite to the dopants used to implant region 12 are implanted into an exposed region of substrate 10. Thus, the thin portion of implant region 12 located under opening 20 is counterdoped to have a majority charge carrier opposite to that of the other portions of implant region 12. Such counterdoping results in implant region 12 being transformed into separate source and drain junctions 24 having a channel region 22 interposed between them. The dopant dose used to implant channel region 22 is pre-selected in order to adjust the threshold voltage of the ensuring transistor. In a CMOS device containing both n- and p- channel devices, it is necessary that these devices have comparable threshold voltages. Further, to provide for maximum current-driving capability, the threshold voltages should also be as small as possible, with the minimum voltage value being dictated by the need to prevent excessive subthreshold currents from developing.

Figure 6:
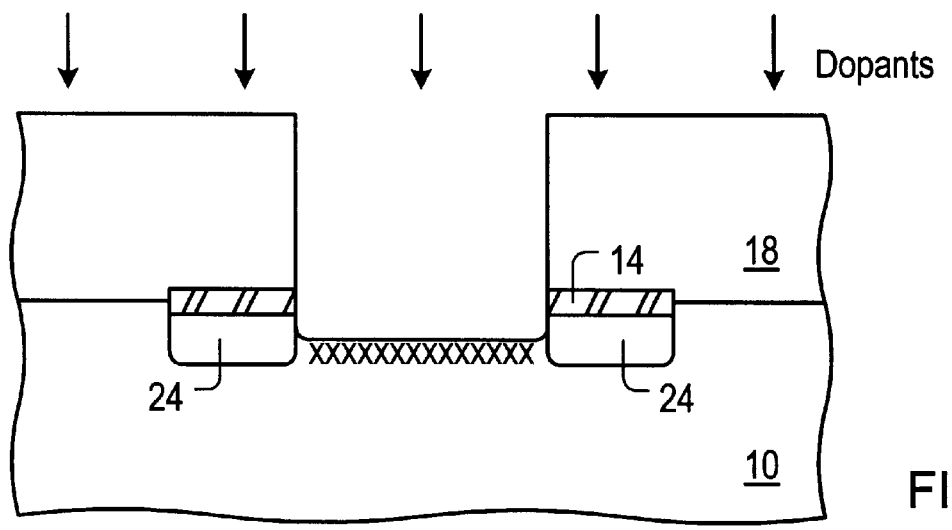
FIG. 6 depicts a cross-sectional view of the semiconductor topography, wherein dopants are again implanted into the exposed region of the substrate to inhibit punchthrough current passing from the source to the bulk substrate.
Figure 7A:
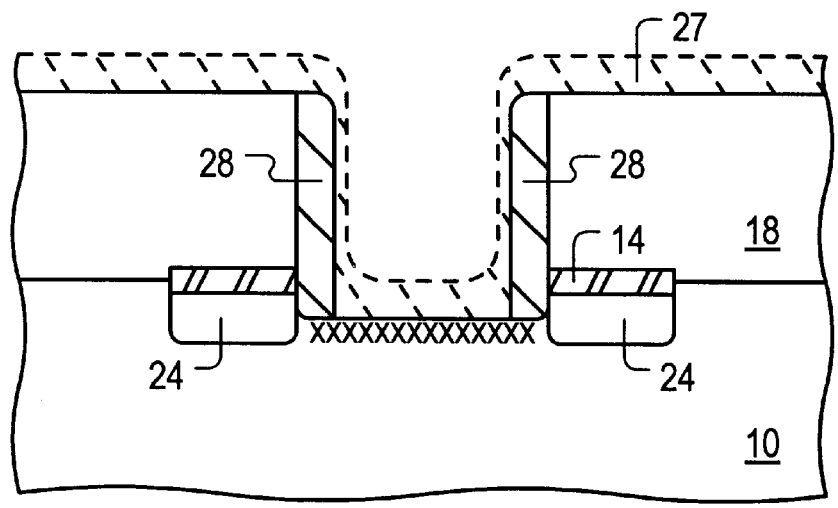
FIG. 7a depicts a cross-sectional view of one embodiment of the semiconductor topography, wherein spacers are formed adjacent to the sidewall surfaces of the sacrificial oxide within the opening.
Figure 7B:
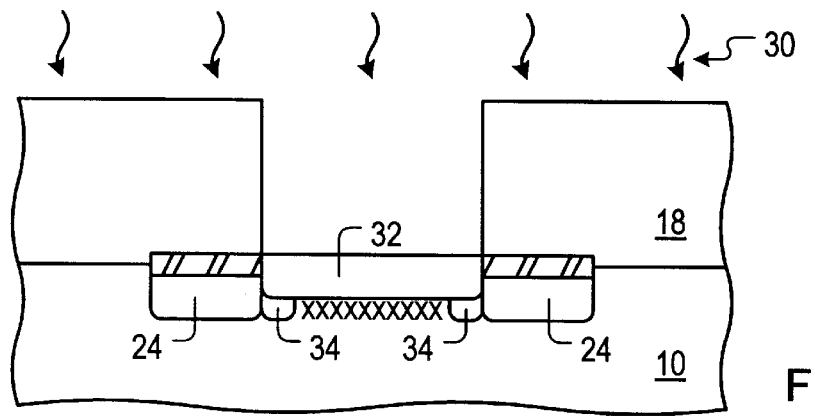
FIG. 7b depicts a cross-sectional view of another embodiment of the semiconductor topography, wherein a gate oxide is thermally grown across the exposed region of the substrate and lightly doped drain regions are formed laterally adjacent to the source and drain junctions, subsequent to the step in FIG. 6.

FIG. 6 illustrates an additional implant into the exposed region of substrate 10. The additional implant is used to prevent punchthrough without the need to raise the dopant concentration of the entire substrate. Punchthrough is a phenomenon that results from the widening of the drain depletion region when a reverse-bias voltage is applied across the drain-well diode. The electric field of the drain junction may eventually penetrate to the source junction, thereby reducing the potential energy barrier of the source-to-body junction. Punchthrough current is therefore associated within the bulk of the substrate, well below the substrate surface.

FIGS. 7a–11a depict one embodiment of the fabrication steps used to form a transistor subsequent to the step shown in FIG. 6. Beginning with FIG. 7a, silicon nitride is deposited across the exposed surfaces of sacrificial material 18 and substrate 10. A portion 27 of the silicon nitride is then anisotropically etched away to form nitride spacers 28 directly adjacent to sidewall surfaces of sacrificial material 18. Since an anisotropic etch removes material at a faster rate vertically than horizontally, etch duration is terminated before etchant ions can attack a predetermined thickness of the nitride disposed immediately adjacent the sidewall surfaces. The desired thicknesses of spacers 28 are thus achieved. Spacers 28 may also be composed of other insulating materials, such as oxide provided that the spacers are not made of the same material as sacrificial material 18.

Figure 8A:
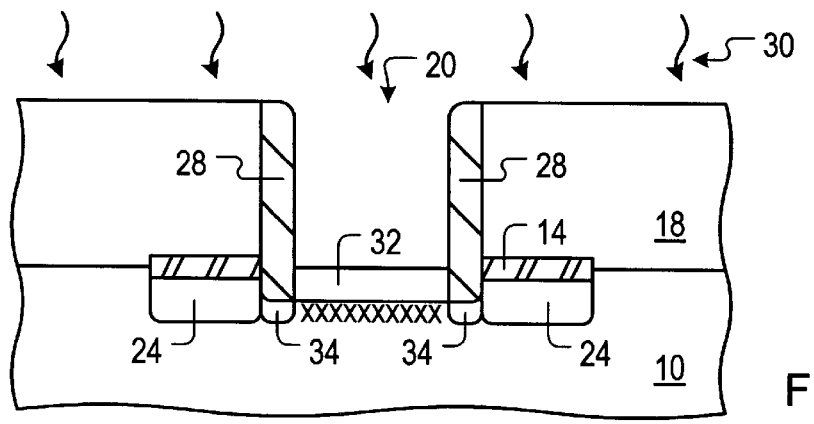
FIG. 8a depicts a cross-sectional view of the semiconductor topography, wherein a gate oxide is thermally grown across the exposed region of the substrate while concurrently forming lightly doped drain regions laterally adjacent to the source and drain junctions.
Figure 8B:
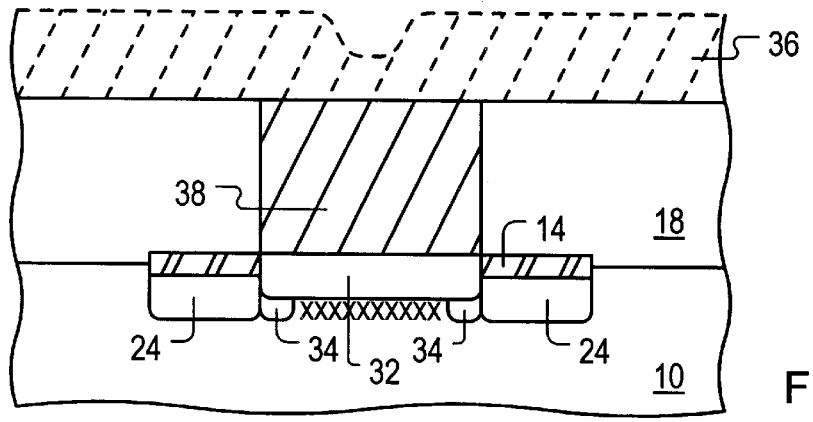
FIG. 8b depicts a cross-sectional view of the semiconductor topography, wherein a polysilicon gate conductor is formed exclusively between opposed sidewall surfaces of the sacrificial oxide within the opening, subsequent to the step in FIG. 7b.

FIG. 8a illustrates the semiconductor topography being exposed to thermal radiation 30. The heat produced by thermal radiation 30 may initiate reaction between ambient oxygen atoms and silicon atoms within substrate 10, thereby growing a gate oxide 32 across the exposed portion of the substrate. Gate oxide 32 reduces the depth of opening 20 and extends horizontally between nitride spacers 28. Thermal radiation 30 further causes dopants within source and drain junctions 24 to migrate into the channel. Lightly doped drain areas 34 form during exposure to thermal radiation 30. Preferably, areas 34 arise as dopants from source and drain regions 24 migrate toward the channel area. The migrated dopants are, however, less concentrated than the source and drain dopant concentration. Thus, LDD areas 34 occur, and graded junctions result in which dopant concentration decreases in a lateral direction toward the channel.

Figure 9A:
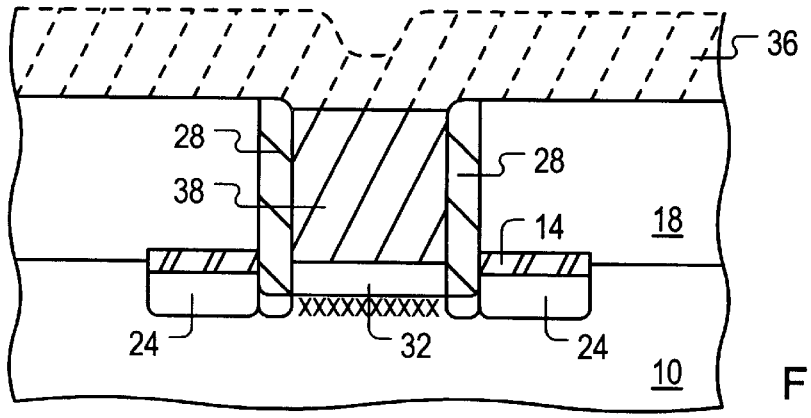
FIG. 9a depicts a cross-sectional view of the semiconductor topography, wherein a polysilicon gate conductor is formed exclusively between the two nitride spacers within the opening.
Figure 9B:
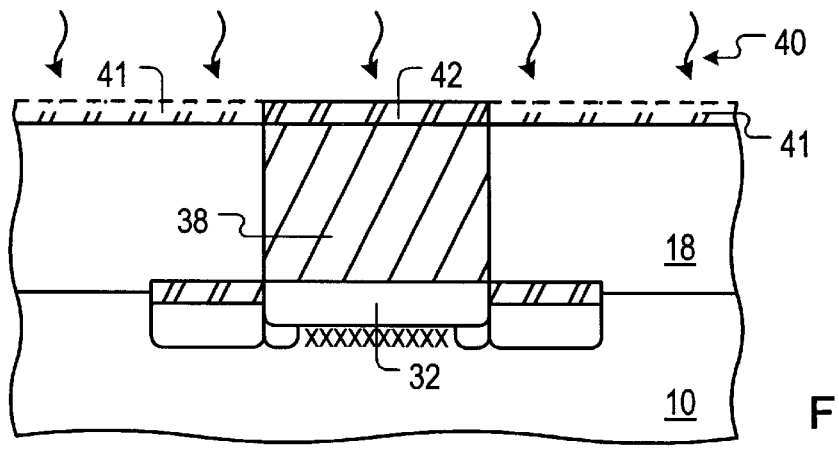
FIG. 9b depicts a cross-sectional view of the semiconductor topography, wherein a polycide is formed across the upper surface of the gate conductor using a one-step anneal, subsequent to the step in FIG. 8b.
Figure 10A:
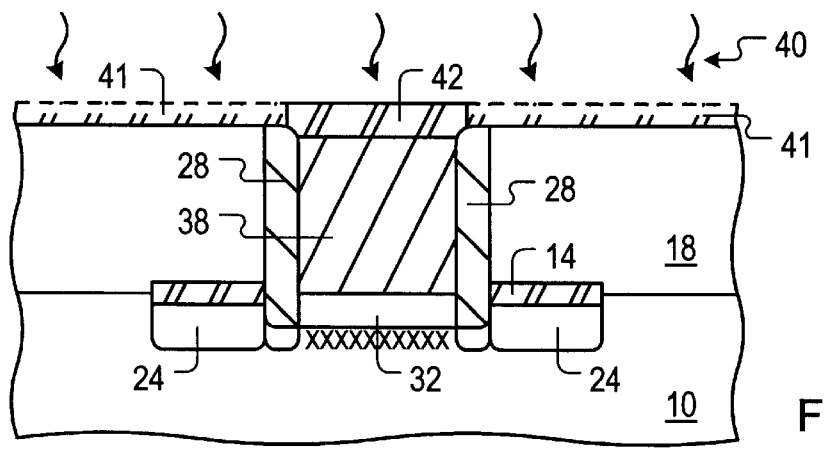
FIG. 10a depicts a cross-sectional view of the semiconductor topography, wherein a polycide is formed across the upper surface of the gate conductor using a one-step anneal.
Figure 10B:
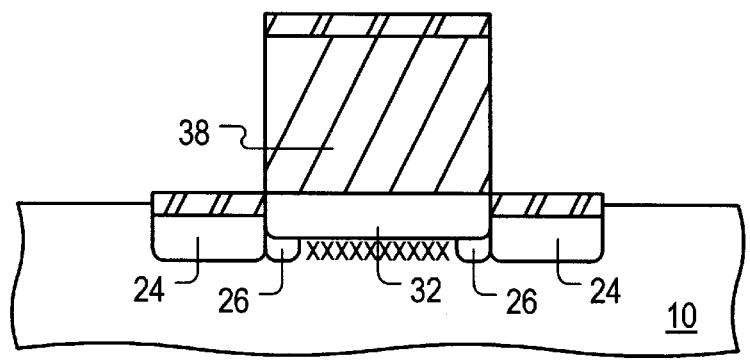
FIG. 10b depicts a cross-sectional view of the semiconductor topography, wherein the sacrificial oxide is removed to form a transistor having silicide formed across the junctions and polycide formed across the gate conductor, subsequent to the step in FIG. 9b.

FIG. 9a depicts the formation of a gate conductor 38 across gate oxide 32 and between nitride spacers 28. Forming gate conductor 38 first involves depositing polysilicon across the upper surface of sacrificial material 18 and into opening 20. Chemical-mechanical polishing may be used to remove portion 36 of the polysilicon and to make the surface of the sacrificial material level with the surface of the gate conductor. FIG. 10a depicts the formation of a polycide 42 across the upper surface of gate conductor 38. The polycide 42 is formed similarly to the silicide layer 14. Titanium is deposited across gate conductor 38 and then exposed to thermal radiation 40 at a high temperature to form polycide 42. Since sacrificial material 18 contains silicon bonded to oxygen, some available, unbonded silicon atoms within the sacrificial material may exist. These silicon atoms may react with titanium atoms to form unwanted titanium silicide regions 41 across sacrificial material 18. The presence of the sacrificial material advantageously prevents silicide from forming upon or within spacers 28 because titanium does not get deposited near the sides of the spacers.

Figure 11A:
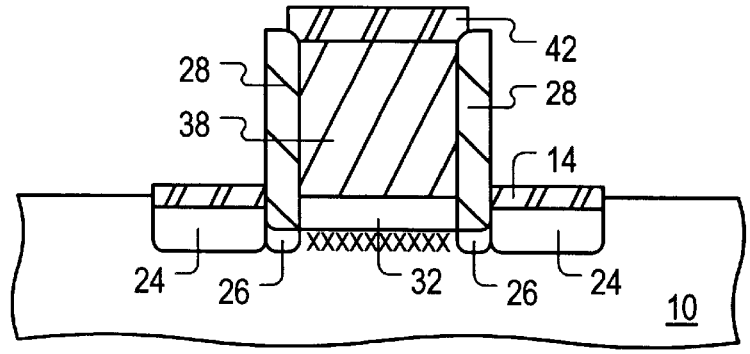
FIG. 11a depicts a cross-sectional view of the semiconductor topography, wherein the sacrificial oxide is removed to form a transistor having silicide formed across the junctions and polycide formed across the gate conductor.

As depicted in FIG. 11a, silicide regions 41 and sacrificial material 18 are removed to complete the formation of a transistor. Sacrificial material 18 and excess silicide regions 41 may be removed using a plasma etch. A photoresist masking layer is formed across polycide 42 prior to etching so that polycide 42 is protected from being attached by etchant ions. Sacrificial material 18 and silicide regions 41 may alternately be removed by first using an etchant that selectively attacks the sacrificial material and then using an etchant that selectively attacks silicide not covered by a photoresist masking layer. The resulting transistor has silicide contact areas formed upon its junctions and a polycide contact area formed upon its gate conductor. These contact areas are good conductors and enhance the performance of an integrated circuit employing them. As discussed previously, silicide shorting between silicide layer 24 and polycide layer 42 is not a problem. Further, spacers 28 serve to prohibit electrical communication between silicide layer 24 and gate conductor 38.

FIGS. 7b–10b illustrate another embodiment of transistor fabrication steps that may be used instead of the steps presented in FIGS. 7a–11a. This embodiment is different from the previous embodiment because the transistor that is formed has no spacers adjacent to sidewall surfaces of the gate conductor. The thermal oxidation presented in FIG. 7b may be performed subsequent to the step in FIG. 6. Thermal radiation 30 is used to grow a gate oxide 32 across the exposed substrate region. Gate oxide 32 is preferably formed to a thickness that places the upper surface of oxide 32 slightly above titanium silicide layer 14. The gate oxide thickness is controlled to prevent silicide layer 14 from contacting the ensuing gate conductor of the transistor. Lightly doped drain regions 34 may also be formed in response to the heat provided by thermal radiation 30. FIG. 8b depicts the formation of a polysilicon gate conductor 38 across gate oxide 32, exclusively between the sidewall surfaces of sacrificial material 18. As shown in FIG. 9b, a polycide layer 42 is then formed across gate conductor 38 using a single high temperature anneal. Subsequently, excess portions 41 of silicide that may have formed across sacrificial material 18 may be removed. Sacrificial material 18 is also removed, resulting in a transistor having silicide and polycide contact regions. Gate oxide 32 is configured so that the gate conductor and the silicide layer do not contact each other in the spacer-absent transistor.

It will be appreciated to those skilled in the art having the benefit of this disclosure that this invention is believed to provide a method for forming good silicide contacts to a transistor using a single anneal step. It is intended that the following claims be interpreted to embrace all such modifications and changes and, accordingly, the specification and drawings are to be regarded in an illustrative rather than a restrictive sense.

What is claimed is:

1. A method for forming a transistor, comprising:
   implanting a first dopant into a portion of a semiconductor topography to form an implant region;
   forming a silicide layer exclusively across said implant region;
   depositing a sacrificial material across said silicide layer;
   etching a contiguous opening vertically through a portion of the sacrificial material and said silicide layer, thereby exposing a region of said semiconductor topography;
   implanting a second dopant into said exposed region of said semiconductor topography;
   forming a polysilicon gate conductor exclusively within said opening above said exposed region; and
   removing the sacrificial material to form said transistor.

2. The method of claim 1, wherein said contiguous opening further extends vertically through said implant region such that said implant region is partially separated into a source region and a drain region, said opening being partially interposed between said source and drain regions.

3. The method of claim 2, wherein implanting said second dopant forms a channel between said source and drain regions.

4. The method of claim 2, further comprising implanting a third dopant into said exposed region for inhibiting a punchthrough current from flowing from said source region to said semiconductor topography.

5. The method of claim 2, further comprising:
   depositing a spacer material across said sacrificial material and into said opening after implanting said second dopant; and
   anisotropically removing portions of said spacer material to form spacers laterally adjacent to opposing sidewall surfaces of said sacrificial material, said sidewall surfaces being formed concurrent with forming said contiguous opening.

6. The method of claim 5, further comprising thermally growing an oxide layer across said channel region while concurrently forming lightly doped drain areas laterally adjacent to said source and drain regions at least partially beneath said spacers.

7. The method of claim 1, wherein forming said polysilicon gate conductor comprises depositing a polysilicon layer across said sacrificial material and into said opening and removing a portion of said polysilicon layer exclusive of said opening via chemical mechanical polishing of said polysilicon layer.

8. The method of claim 1, wherein forming said silicide layer comprises depositing a metal layer across said semiconductor topography, annealing said metal layer at a temperature above 700°C. to form said silicide layer, and removing portions of said silicide layer from said semiconductor topography exclusive of across said implant region.

9. The method of claim 8, wherein said temperature is above about 1000° C.

10. The method of claim 1, further comprising forming another silicide layer across said gate conductor.

11. The method of claim 1, further comprising removing said sacrificial material from said semiconductor topography.

* * * * *